United States Patent
Hesse et al.

(10) Patent No.: US 12,340,994 B2
(45) Date of Patent: Jun. 24, 2025

(54) MEASUREMENT APPARATUS FOR ALTERNATING CURRENTS AND VOLTAGES OF PHYSICAL PLASMAS, PARTICULARLY OF COLD PLASMAS AT ATMOSPHERIC PRESSURE, AND PLASMA GENERATOR COMPRISING SUCH A MEASUREMENT APPARATUS

(71) Applicant: Hochschule für angewandte Wissenschaft und Kunst Hildesheim/Holzminden/Göttingen, Hildesheim (DE)

(72) Inventors: Mario Hesse, Göttingen (DE); Jannik Schulz, Göttingen (DE); Roland Damm, Ebergötzen (DE); Wolfgang Viöl, Adelebsen (DE)

(73) Assignee: Hochschule für angewandte Wissenschaft und Kunst Hildesheim/Holzminden/Göttingen, Hildesheim (DE)

( * ) Notice: Subject to any disclaimer, the term of this patent is extended or adjusted under 35 U.S.C. 154(b) by 99 days.

(21) Appl. No.: 18/226,841

(22) Filed: Jul. 27, 2023

(65) Prior Publication Data
US 2024/0038512 A1    Feb. 1, 2024

(30) Foreign Application Priority Data
Jul. 27, 2022   (EP) ..................................... 22187261

(51) Int. Cl.
*H01J 37/32* (2006.01)
*H05H 1/00* (2006.01)
*H05H 1/24* (2006.01)

(52) U.S. Cl.
CPC .. *H01J 37/32981* (2013.01); *H01J 37/32577* (2013.01); *H01J 37/32642* (2013.01); *H05H 1/0018* (2013.01); *H05H 1/2425* (2021.05)

(58) Field of Classification Search
CPC .......... H01J 37/32981; H01J 37/32577; H01J 37/32642; H05H 1/2425; H05H 1/0018
See application file for complete search history.

(56) References Cited

U.S. PATENT DOCUMENTS 4,000,361 A * 12/1976 Bondarenko .......... B22D 23/10
                                                                  164/450.1
7,345,428 B2    3/2008 Turner
(Continued)

FOREIGN PATENT DOCUMENTS

DE       202007012065 U1    10/2007
EP               3719482 A2 * 10/2020  ............. G01J 3/443
(Continued)

*Primary Examiner* — Adam D Houston
(74) *Attorney, Agent, or Firm* — Thomas | Horstemeyer, LLP

(57) ABSTRACT

A measurement apparatus for alternating currents and voltages of a physical plasma ignited by applying an alternating high voltage from an alternating high voltage source to a plasma electrode via a high voltage line comprises a current transformer having a measurement winding on a ring core and a cable guide guiding the high voltage line through the ring core. A first measurement alternating voltage dropping over a measurement resistor connected between ends of the measurement winding is a first strictly monotonic increasing function of an amperage of the alternating currents flowing through the high voltage line. A second measurement voltage dropping over a measurement capacitance connected between a center tap of the measurement winding and a reference potential connector is a second strictly monotonic increasing function of an amplitude of the alternating high
(Continued)

voltage applied to the plasma electrode with respect to a reference potential at the reference potential connector.

17 Claims, 2 Drawing Sheets

(56) References Cited

U.S. PATENT DOCUMENTS

| | | | |
|---|---|---|---|
| 10,674,594 B2* | 6/2020 | Watson | H05H 1/46 |
| 11,398,371 B2* | 7/2022 | Kofuji | H01L 21/6833 |
| 11,955,314 B2* | 4/2024 | Koshimizu | H01J 37/32577 |
| 12,062,524 B2* | 8/2024 | Zhao | H01L 21/6833 |
| 12,218,497 B1* | 2/2025 | Pickrell | H03K 17/102 |
| 2002/0190705 A1 | 12/2002 | Skendzic | |
| 2015/0221478 A1* | 8/2015 | Himori | H01J 37/32082 |
| | | | 156/345.38 |
| 2017/0156200 A1* | 6/2017 | Watson | A61L 2/0094 |
| 2019/0206703 A1* | 7/2019 | Zhao | H01J 37/32174 |
| 2023/0317439 A1* | 10/2023 | Lim | H01J 37/32935 |
| | | | 156/345.28 |
| 2024/0038512 A1* | 2/2024 | Hesse | G01R 19/0061 |
| 2024/0212979 A1* | 6/2024 | Tanaka | H05H 1/46 |

FOREIGN PATENT DOCUMENTS

| | | | | |
|---|---|---|---|---|
| EP | 4312032 A1 * | 1/2024 | | G01R 15/06 |
| WO | 9942845 A1 | 8/1999 | | |
| WO | 2010098779 A1 | 9/2010 | | |

\* cited by examiner

MEASUREMENT APPARATUS FOR ALTERNATING CURRENTS AND VOLTAGES OF PHYSICAL PLASMAS, PARTICULARLY OF COLD PLASMAS AT ATMOSPHERIC PRESSURE, AND PLASMA GENERATOR COMPRISING SUCH A MEASUREMENT APPARATUS

CROSS REFERENCE TO RELATED APPLICATIONS

This application claims priority to co-pending European Patent Application No. EP 22 187 261.7 filed Jul. 27, 2022 and entitled "Messvorrichtung für Wechselströme und-hochspannungen von physikalischen Plasmen, insbesondere von kalten Atmosphärendruckplasmen, sowie Plasmagenerator mit einer solchen Messvorrichtung".

FIELD OF THE INVENTION

The present invention generally relates to measuring alternating currents and voltages of physical plasmas like, for example, cold plasmas at atmospheric pressure. More particularly, the invention relates to a measurement apparatus for alternating currents and voltages of physical plasmas, and to a plasma generator comprising an alternating high voltage source, a plasma electrode connected to the alternating high voltage source via a high voltage line, and such a measurement apparatus.

In order to control the ignition of physical plasmas and/or to monitor the state of physical plasmas, it is suitable to register the alternating high voltages applied to the plasma electrode and the alternating currents flowing via the plasma electrode. The product of these alternating high voltages and alternating currents is an electric power which is essentially turned over in the physical plasma.

Thus, the invention also relates to igniting and monitoring physical plasmas which are generated by applying an alternating high voltage to a plasma electrode and resulting gas discharges with regard to a reference potential like the electric earth. Even more particularly, it is about cold plasmas at atmospheric pressure in which the gas discharges are barred dielectrically.

BACKGROUND OF THE INVENTION

Often, alternating high voltage sources of plasma generators comprise a transformer in order to transform an alternating voltage present at the primary winding of the transformer into an alternating high voltage. For example, it is known from WO 2010/098 779 A1 to measure the course of the alternating voltages dropping over the primary winding of such a transformer and the amperage of an alternating current flowing through the primary winding with separate voltage measuring heads and current transformers and to deduce the course of the alternating high voltages and the amperage of the alternating currents at the secondary side of the transformer therefrom, which drop over the plasmas generated on the secondary side and flow therethrough, respectively. However, this indirect measurement of the alternating currents and high voltages of physical plasmas proves to be inaccurate.

So-called current transformers are known for measuring alternating currents through lines in a potential-free way. A current transformer comprises a ring core enclosing the respective line. A measurement winding is arranged on the ring core. An alternating current flowing through the line induces an alternating magnetic field in the ring core which generates a voltage between the ends of the measurement winding. A alternating measurement voltage which drops over a measurement resistor connected between the ends of the measurement winding is a strictly monotonic increasing function of the amperage of the alternating currents flowing through the line. Different current transformers are offered on the website www.pearson.com; some of them have folding ring cores and/or are provided with a guidance for the respective line through the ring core.

There still is a need of a measurement apparatus for alternating currents and high voltages of physical plasmas, particularly of cold plasmas at atmospheric pressure, and of a plasma generator comprising such a measurement apparatus, in which the alternating currents flowing via the plasma electrode and the alternating high voltages applied thereto are measured at an as low effort as possible and nevertheless as directly and as accurately as possible.

SUMMARY OF THE INVENTION

The present invention relates to a measurement apparatus for alternating currents and alternating voltages of a physical plasma ignited in a working gas by applying an alternating high voltage provided by an alternating high voltage source with respect to the reference potential to a plasma electrode via a high voltage line. The measurement apparatus comprises a current transformer having a ring core and a measurement winding on the ring core, the measurement winding having two ends and a center tap, and a cable guide configured for guiding the high voltage line in a defined relative arrangement through the ring core. A measurement resistor is connected between the two ends of the measurement winding. A first measurement alternating voltage dropping over the measurement resistor is a first strictly monotonic increasing function of an amperage of the alternating currents flowing through the high voltage line to the plasma electrode. A measurement capacitance is connected between the center tap of the measurement winding and a reference potential connector; and a second measurement voltage dropping over the measurement capacitance is a second strictly monotonic increasing function of an amplitude of the alternating high voltage applied to the plasma electrode with respect to the reference potential present at the reference potential connector.

The present invention relates to a plasma generator comprising an alternating high voltage source configured for outputting an alternating high voltage with respect to a reference potential, a plasma electrode configured for igniting a physical plasma in a working gas by applying the alternating high voltage which causes electric discharges with respect to the reference potential, a high voltage line connected to the alternating high voltage source and the plasma electrode and configured for applying the alternating high voltage to the plasma electrode, and the above measurement apparatus for alternating currents and voltages of the physical plasma.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are

DETAILED DESCRIPTION

Figure 1:
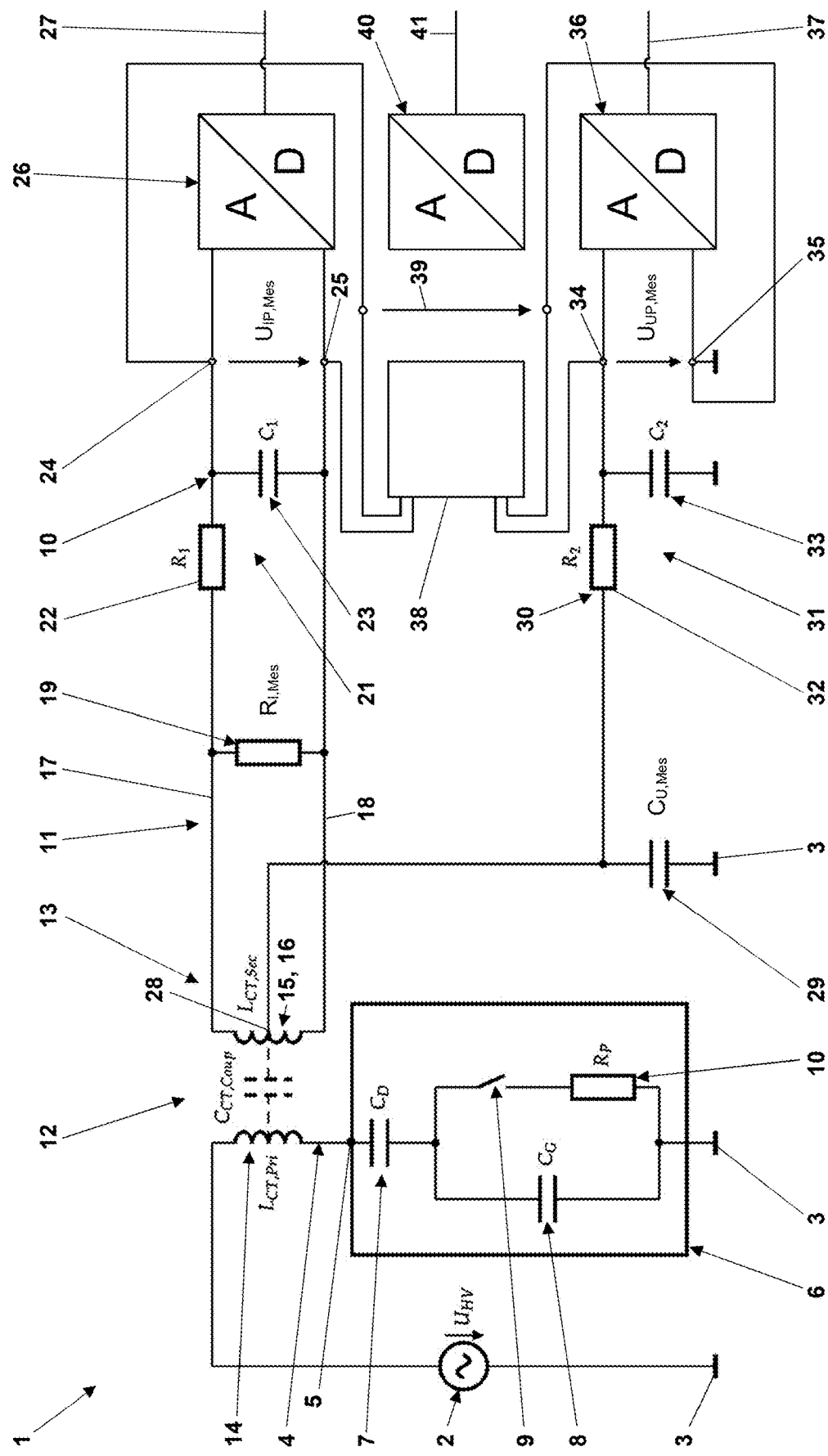
FIG. 1 is a circuit diagram of a plasma generator according to the invention comprising a measurement apparatus according to the invention, wherein a plasma generated by the plasma generator is illustrated by an equivalent circuit diagram.

A measurement apparatus for alternating currents and high voltages of physical plasmas comprises a current transformer having a ring core and a measurement winding on the ring core, a cable guide configured for guiding a high voltage line running from an alternating high voltage source to a plasma electrode in a defined relative arrangement through the ring core, a measurement resistor connected between ends of the measurement winding, and a measurement capacitance connected between a center tap of the measurement winding and a reference potential connector. A first measurement alternating voltage dropping over the measurement resistor, which can be tapped there, is a first strictly monotonic increasing function of an amperage of the alternating currents flowing through the high voltage line to the plasma electrode; and a second measurement alternating voltage dropping over the measurement capacitance is a strictly monotonic increasing function of a course of the alternating high voltage applied to the plasma electrode via the high voltage line with respect to a reference potential connected to the reference potential connector. With a usual dimensioning of the ring core of the current transformer, the strictly monotonic increasing functions are linear functions of the amperage of the alternating currents and the course of the alternating voltages, respectively. Further, the frequencies of the measurement alternating voltages equal those of the alternating currents and alternating high voltages, respectively. So far as phase shifts are present between the measurement alternating voltages and the alternating currents and alternating voltages, respectively, which may be frequency dependent, these phase shifts may be determined once and compensated for in a simple way afterwards.

The measurement apparatus utilizes the known principle of a current transformer for measuring the alternating currents. For the measurement of the alternating high voltages, the measurement apparatus makes use of the fact that primary winding and secondary winding of a transformer and, thus, also the high voltage line leading through the ring core and the measurement winding in the measurement apparatus are always not only inductively but also capacitively coupled, i.e. without any capacitor being connected between the primary winding and the high voltage line, respectively, on the one hand, and the secondary winding and the measurement winding, respectively, on the other hand. This inherent capacitive coupling results in the second measurement alternating voltage which drops over the measurement capacitance connected between the center tap of the measurement winding and the reference potential. The capacitance of the inherent capacitive coupling between the high voltage line and the measurement winding proves to be constant as long as the relative arrangement of the ring core and the high voltage line guided therethrough remains constant, which is ensured by the cable guide of the measurement apparatus. The capacitance of the inherent capacitive coupling may be small, and it is in a typical order of a few picofarad, i.e. for example between 1 and 10 pF. However, just this allows for providing a capacitive voltage divider by means of a comparatively small measurement capacitance in the nF range such that, with alternating high voltages of an order of magnitude of 10,000 V, an easily usable second measurement voltage in the volt range drops over the measurement capacitance.

The measurement capacitance also has the result that the first measurement alternating voltage has a fixed reference to the reference potential. The measurement capacitance may be realized by one capacitor or a plurality of interconnected capacitors.

The cable guide of the measurement apparatus may be configured for coaxially guiding the high voltage line through the ring core. The cable guide may be a shaped body supported at the ring core or a housing of the ring core, at the one end, and supporting the high voltage line, at the other end. This shaped body may be 3D printed to adapt it to the respective ring core or its housing, respectively, and to the respective high voltage line. The insert may be multi-part to close it around the respective high voltage line. The ring core may also be foldable to assemble it around the respective cable guide and the respective high voltage line. It is to be understood that the cable guide is to be made of a non-magnetic and non-electrically conductive material and may particularly be made of plastic.

In the measurement apparatus, a first low pass filter may be connected between connections of the measurement resistor and tap points for the first measurement alternating voltage. This low pass filter may, for example, comprise an RC member. A first cut-off frequency of the first low pass filter may be selected depending on a sample rate of a first A/D converter for the first measurement alternating voltage so that, in sampling a signal having the cut-off frequency, the Nyquist-Shannon criterion is kept according to which the sample rate for the error free and artefact free sampling of a signal of a signal frequency has to be at least twice as high as the signal frequency.

A second low pass filter may be connected between connections of the measurement capacitance and tap points for the second measurement alternating voltage. This second low pass filter may have a second RC member. A second cut-off frequency of the second low pass filter may be adjusted to a sample rate of a second A/D converter for the measurement alternating voltage, wherein the Nyquist-Shannon criterion has also to be considered here.

Typically, the first cut-off frequency of the first low pass filter and the second cut-off frequency of the second low pass filter are equal, in a same way as a first sample rate of the first A/D converter for the first measurement alternating voltage and a second sample rate of a second A/D converter for the second measurement alternating voltage will be equal. Further, the first and the second A/D converter may be synchronized with regard to their sample rates.

The electric power of the respective plasma may be calculated from the first and second measurement alternating voltages tapped at the measurement apparatus. However, it is also possible to provide an analogous multiplier for the first measurement alternating voltage and the second measurement alternating voltage in the measurement apparatus, which outputs a product voltage. This product voltage is then directly proportional to the electric power of the plasma of interest. It is to be understood that a further low pass filter and/or a further A/D converter may be provided for the product voltage.

In a plasma generator according comprising an alternating high voltage source configured for outputting an alternating high voltage with respect to a reference potential at a high voltage line connector, a plasma electrode configured for, with an applied alternating high voltage, igniting a physical plasma in a working gas by electric discharges with respect to the reference potential, and a high voltage line connected to the high voltage line connector and the plasma electrode, which is configured for applying the alternating high voltage to the plasma electrode, a measurement apparatus is provided for alternating currents and voltages of the physical plasma.

In the plasma generator, a dielectric barrier of the plasma electrode may be configured for dielectrically barring the electric discharges with respect to the reference potential. A dielectric barrier to the electric discharges may alternatively also be effected by a capacitive coupling of the plasma electrode to the high voltage line. By means of the dielectric barrier, the plasma generator is particularly suited for generating cold plasmas at atmospheric pressure. More generally, it applies that the measurement apparatus, by means of its current transformer, can only measure alternating currents and alternating voltages. It is not suited for the measurement of direct currents and direct voltages of plasmas and corresponding plasma generators operating with direct voltage. The measurement apparatus does also not recognize a direct current which is superimposed to an alternating current with changing flow direction, and no direct voltage which is superimposed to an alternating voltage with a change of polarization. However, the measurement apparatus is suited for all kinds of alternating currents and voltages, i.e. not just for sinus-shaped but also for alternating currents and voltages of any time course, particularly also for pulsed alternating currents and voltages.

It is to be understood that both the capacitance of a dielectric barrier of the plasma electrode and of a capacitive coupling of the plasma electrode to the high voltage line have to be considered in determining the alternating voltage of the plasma from the second measurement voltage. However, if the alternating voltage is directly multiplied with the alternating current and the resulting product is averaged, the influences of any capacitances of the alternating voltage are removed, because they only result in a reactive power with changing sign but in no active power. If no resistive elements are electrically connected in series with the plasma, the active power determined from the alternating voltage and the alternating current in this or any other way is that one of the plasma.

Referring now in greater detail to the drawings, the plasma generator 1 depicted in FIG. 1 comprises an alternating high voltage source 2 which generates an alternating high voltage $U_{HV}$ with respect to a reference potential 3, for example the electric earth or any other electric ground. The alternating high voltage $U_{HV}$ is applied to a plasma electrode 5 via a high voltage line 4. The plasma electrode 5 is provided with a dielectric barrier which, in a plasma model 6, results in a barrier capacitance $C_D$ of a capacitor 7. A capacitor 8 of the plasma model 6 represents an electric capacitance $C_G$ which is present prior to igniting the plasma across a discharge gap. With igniting the plasma, a switch 9 of the plasma model 6 is closed. A resistor 10 connected in series with the switch 9 represents the ohmic resistance $R_P$ of the plasma which is ignited by the alternating high voltage $U_{HV}$ applied to the plasma electrode 5 with respect to the reference potential 3.

A measurement apparatus 11 for measuring alternating current and voltage of the plasma comprises a current transformer 12 which is illustrated as a transformer having a primary winding 14 and a secondary winding 15 here. In practice, the current transformer 12 has a ring core not depicted in FIG. 1 on which the secondary winding 15 is arranged as a measurement winding 16 and through which the high voltage line 4 runs and thus forms a primary winding 14 without a single full winding. Nevertheless, the primary winding 14 has an inductance $L_{CT,Pri}$ via which the ring core is inductively coupled to an inductance $L_{CT,Sec}$ of the secondary winding. Further, the primary winding 14 and the secondary winding 15 are inherently, i.e. without a capacitor being actually present, capacitively coupled at a capacitance $C_{CT,Coup}$. A measurement resistor 19 having an ohmic resistance $R_{I,Mes}$ is connected between ends 17 and 18 of the measurement winding 16. A first low pass filter 20 comprising an RC member 21 consisting of a resistor 11 having an ohmic resistance $R_1$ and a capacitor 23 having a capacitance $C_1$ is provided for the first measurement voltage $U_{IP,Mes}$ dropping over the measurement resistor 19. A first A/D converter 26 outputting a first measurement signal 27 is provided for the low pass filtered first measurement alternating voltage $U_{IP,Mes}$ which is present at tap points 24 and 25. The first measurement signal 27 is proportional to an alternating current flowing through the high voltage line 4 to the plasma electrode 5 and, thus, through the plasma.

A measurement capacitance 29 having an electric capacitance $C_{U,Mes}$ is connected between a center tap 28 of the measurement winding 16 and the reference potential 3. Together with the coupling capacitance $C_{CT,Coup}$, the measurement capacitance $C_{U,Mes}$ forms a capacitive voltage divider for the alternating high voltage $U_{HV}$. A second low pass filter 30 comprising a second RC member 31 consisting of a second resistor 32 having an ohmic resistance $R_2$ and a second capacitor 33 having a capacitance $C_2$ is provided for a second measurement alternating voltage $U_{UP,Mes}$ dropping over the measurement capacitance 29. A second A/D converter which outputs a second measurement signal 37 is connected to second tap points 34 and 35 for the low pass filtered second measurement alternating voltage $U_{UP,Mss}$. The second measurement signal 37 is proportional to the alternating high voltage $U_{HV}$ applied to the plasma electrode 5. Additionally, the first measurement taps 24 and 25 and the second measurement taps 34 and 35 are connected to an analogous multiplier 38 which outputs a product voltage 39. A further A/D converter 40 which outputs a further measurement signal 41 is provided for the product voltage 39. The measurement signal 41 is proportional to the electric power of the plasma.

Figure 2:
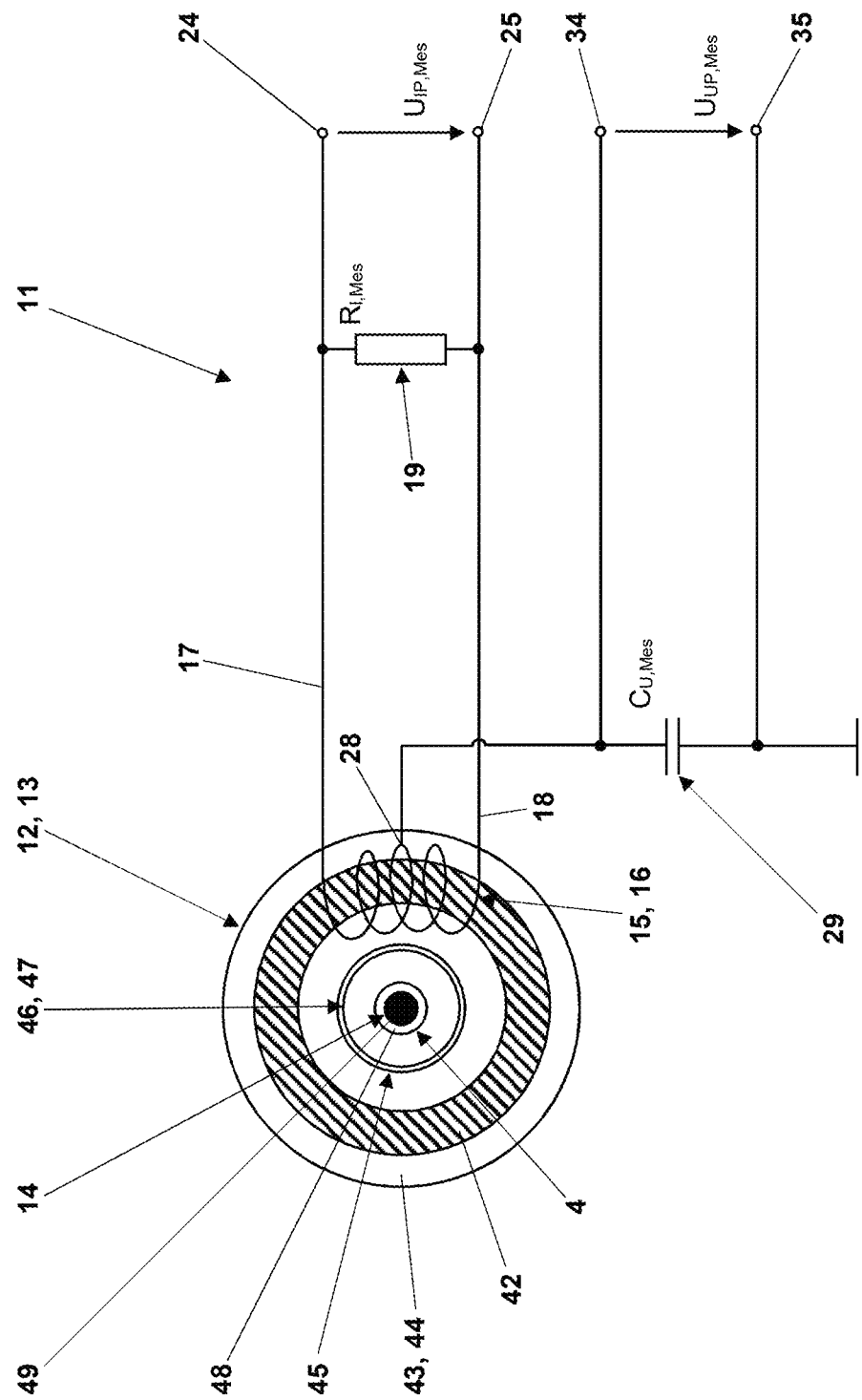
FIG. 2 is a schematic diagram of a more practical embodiment of the measurement apparatus according to the invention.

FIG. 2 shows a more practical embodiment of the current transformer 12 having the ring core 42 on which the measurement winding 16 is arranged and through which the high voltage line 4 leads through. Together with the measurement winding 16, the ring core 42 is embedded in a non-magnetic and non-electrically conductive potting compound 43 which forms a housing 44. A shaped body 46 of a guide 47 for the high voltage line 4 is inserted into this housing 44. The shaped body 46 rests against the housing 44 and an insulation 48 of the high voltage line 4 which encloses its electrically conductive core 49. The guide 47 guides the high voltage line, particularly its electrically conductive core 40, coaxially through the ring core 42. The low pass filters 20 and 30, the multiplier 38 and the A/D converters 26, 36 and 40 of the measurement apparatus 11 are not depicted in FIG. 2.

In a practical embodiment of the measurement apparatus 11, the inductance $L_{CT,Pri}$ of the primary winding 14 of the transformer formed by the current transformer 12 was 6.40 pH, the inductance $L_{C,Sec}$ of the secondary winding 15 on each side of the center tap 28 was 3.10 mH, and the coupling capacitance $C_{CT,Cuop}$ was 6.0 pF. The ohmic resistance $R_{I,Mss}$ of the measurement resistor 19 was, for example 6, 12 or 24 Ohm, and, thus, typically less than 50 Ohm. The number of windings of the secondary winding was 24. The ohmic resistances $R_1$ and $R_2$ of the resistors 22 and 32 of the RC members 21 and 31 were 80 Ohm. The capacitances $C_1$ and $C_2$ of the capacitors 23 and 33 of the RC members 21 and 31 were 10 pF. The measurement capacitance $C_{U,Mss}$ was at 60 nF. By means of this measurement apparatus, plasma currents and plasma voltages in an order of 10 A and 30,000 V were successfully measured at a temporal resolution with a sample rate of 500 MHz.

Many variations and modifications may be made to the preferred embodiments of the invention without departing substantially from the spirit and principles of the invention. All such modifications and variations are intended to be included herein within the scope of the present invention, as defined by the following claims.

We claim:

1. A measurement apparatus for alternating currents and alternating voltages of a physical plasma ignited in a working gas by applying an alternating high voltage provided by an alternating high voltage source with respect to the reference potential to a plasma electrode via a high voltage line, the measurement apparatus comprising
    a current transformer having a ring core and a measurement winding on the ring core, the measurement winding having two ends and a center tap,
    a cable guide configured for guiding the high voltage line in a defined relative arrangement through the ring core,
    a measurement resistor connected between the two ends of the measurement winding, wherein a first measurement alternating voltage dropping over the measurement resistor is a first strictly monotonic increasing function of an amperage of the alternating currents flowing through the high voltage line to the plasma electrode, and
    a measurement capacitance connected between the center tap of the measurement winding and a reference potential connector, wherein a second measurement voltage dropping over the measurement capacitance is a second strictly monotonic increasing function of an amplitude of the alternating high voltage applied to the plasma electrode with respect to the reference potential present at the reference potential connector.

2. The measurement apparatus of claim 1, wherein the cable guide is configured for coaxially guiding the high voltage line through the ring core.

3. The measurement apparatus of claim 1, wherein a first low pass filter is connected between connections of the measurement resistor to the two ends of the measurement winding and two first tap points for the first measurement alternating voltage.

4. The measurement apparatus of claim 3, wherein a second low pass filter is connected between connections of the measurement capacitance to the center tap of the measurement winding and to the reference potential connector and two second tap points for the second measurement alternating voltage.

5. The measurement apparatus of claim 4, wherein a first cut-off frequency of the first low pass filter and a second cut-off frequency of the second low pass filter are equal.

6. The measurement apparatus of claim 1, further comprising a first A/D converter for the first measurement alternating voltage and a second A/D converter for the second measurement alternating voltage.

7. The measurement apparatus of claim 1, further comprising an analogous multiplier for the first measurement alternating voltage and the second measurement alternating voltage, the analogous multiplier putting out a product voltage.

8. The measurement apparatus of claim 7, further comprising a further A/D converter for the product voltage.

9. A plasma generator comprising
    an alternating high voltage source configured for outputting an alternating high voltage with respect to a reference potential,
    a plasma electrode configured for igniting a physical plasma in a working gas by applying the alternating high voltage which causes electric discharges with respect to the reference potential,
    a high voltage line connected to the alternating high voltage source and the plasma electrode and configured for applying the alternating high voltage to the plasma electrode, and
    a measurement apparatus for alternating currents and voltages of the physical plasma, the measurement apparatus comprising
        a current transformer having a ring core and a measurement winding on the ring core, the measurement winding having two ends and a center tap,
        a cable guide configured for guiding the high voltage line in a defined relative arrangement through the ring core,
        a measurement resistor connected between the two ends of the measurement winding, wherein a first measurement alternating voltage dropping over the measurement resistor is a first strictly monotonic increasing function of an amperage of the alternating currents flowing through the high voltage line to the plasma electrode, and
        a measurement capacitance connected between the center tap of the measurement winding and a reference potential connector, wherein a second measurement voltage dropping over the measurement capacitance is a second strictly monotonic increasing function of an amplitude of the alternating high voltage applied to the plasma electrode with respect to the reference potential present at the reference potential connector.

10. The plasma generator of claim 9, wherein a dielectric barrier is arranged in front of the plasma electrode and configured for dielectrically barring the electric discharges.

11. The plasma generator of claim 9, wherein the cable guide is configured for coaxially guiding the high voltage line through the ring core.

12. The plasma generator of claim 9, wherein a first low pass filter is connected between connections of the measurement resistor to the two ends of the measurement winding and two first tap points for the first measurement alternating voltage.

13. The plasma generator of claim 12, wherein a second low pass filter is connected between connections of the measurement capacitance to the center tap of the measurement winding and to the reference potential connector and two second tap points for the second measurement alternating voltage.

14. The plasma generator of claim 13, wherein a first cut-off frequency of the first low pass filter and a second cut-off frequency of the second low pass filter are equal.

15. The plasma generator of claim 9, further comprising a first A/D converter for the first measurement alternating voltage and a second A/D converter for the second measurement alternating voltage.

16. The plasma generator of claim 9, further comprising an analogous multiplier for the first measurement alternating voltage and the second measurement alternating voltage, the analogous multiplier putting out a product voltage.

17. The plasma generator of claim 16, further comprising a further A/D converter for the product voltage.

* * * * *